United States Patent [19]
Jones

[11] Patent Number: 5,430,378
[45] Date of Patent: Jul. 4, 1995

[54] NMR QUADRATURE DETECTION ARRAY

[75] Inventor: Randall W. Jones, Elkhorn, Nebr.

[73] Assignee: Board of Regents - Univ of NE, Lincoln, Nebr.

[21] Appl. No.: 199,054

[22] Filed: Feb. 22, 1994

[51] Int. Cl.$^6$ ............................................. G01V 3/00
[52] U.S. Cl. .................................. 324/318; 324/322; 128/653.5
[58] Field of Search ............... 324/318, 322, 309, 307, 324/314; 128/653.5

[56] References Cited

U.S. PATENT DOCUMENTS

| | | | |
|---|---|---|---|
| 4,825,162 | 4/1989 | Roemer et al. | 324/318 |
| 4,947,121 | 8/1990 | Hayes | 324/318 |
| 5,160,891 | 11/1992 | Keren | 128/653.5 |
| 5,198,768 | 3/1993 | Keren | 324/318 |

Primary Examiner—Louis Arana
Attorney, Agent, or Firm—Zarley, McKee, Thomte, Voorhees & Sease; Mark D. Frederiksen

[57] ABSTRACT

A NMR Quadrature Detection Array includes two generally linear arrays; one oriented in a horizontal plane and sensitive to vertically oriented changing magnetic flux, and the other oriented in a vertical plane bisecting the horizontal plane and sensitive to horizontally oriented flux changes. Each horizontal coil is electronically paired with a vertical coil such that their NMR signals are combined in a quadrature fashion before transmission to the NMR system preamplifier. The coil arrays are sized to accommodate easy positioning within the NMR system table top assembly as well as to facilitate rapid and easy patient positioning about the coil elements.

20 Claims, 4 Drawing Sheets

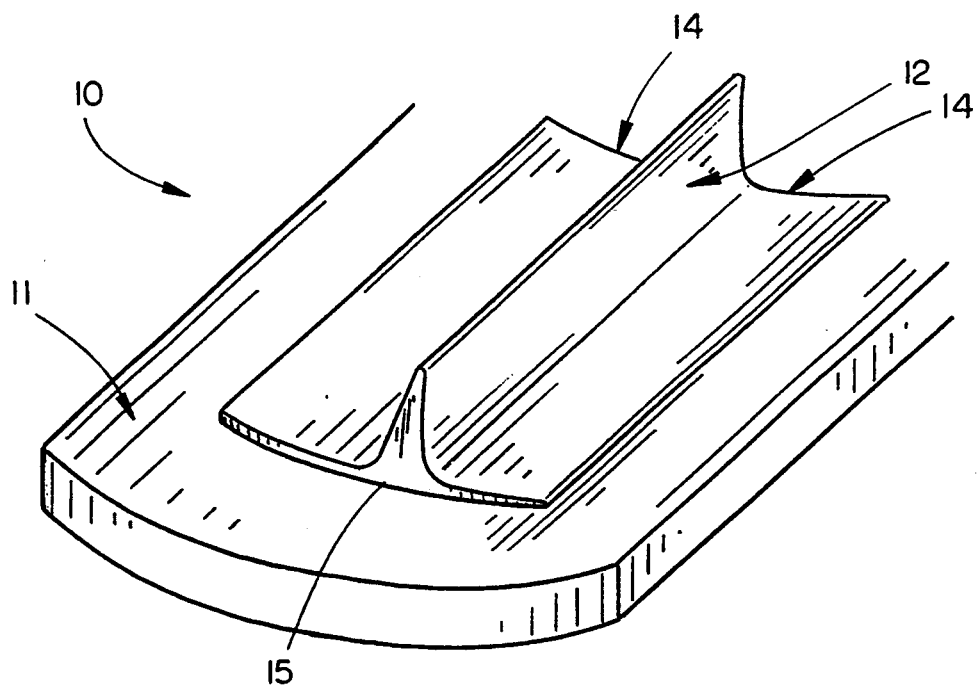
FIG. 1
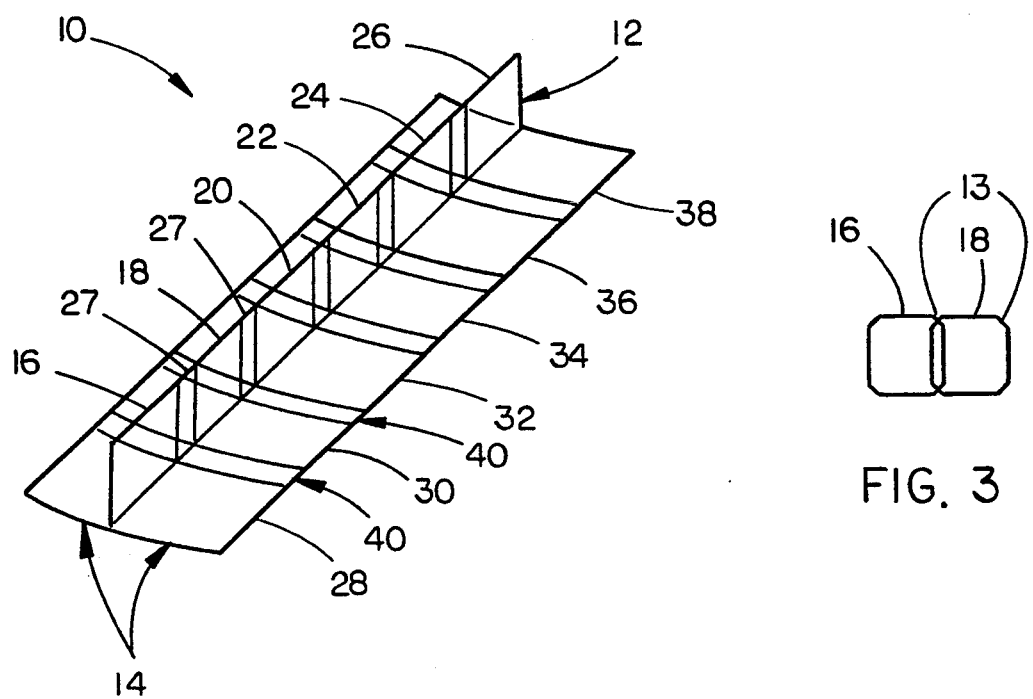
FIG. 2
FIG. 3

NMR QUADRATURE DETECTION ARRAY

TECHNICAL FIELD

The present invention relates generally to magnetic resonance imaging (MRI) and more particularly to local coils for use in receiving MRI signals.

BACKGROUND OF THE INVENTION

A. Magnetic Resonance Imaging

Magnetic resonance imaging (MRI) refers generally to a form of clinical imaging based upon the principles of nuclear magnetic resonance (NMR). Any nucleus which possesses a magnetic moment will attempt to align itself with the direction of a magnetic field, the quantum alignment being dependent, among other things, upon the strength of the magnetic field and the magnetic moment. In MRI, a uniform magnetic field $B_0$ is applied to an object to be imaged; hence creating a net alignment of the object's nuclei possessing magnetic moments. If the static field $B_0$ is designated as aligned with the z axis of a Cartesian coordinate system, the origin of which is approximately centered within the imaged object, the nuclei which posses magnetic moments precess about the z-axis at their Larmor frequencies according to their gyromagnetic ratio and the strength of the magnetic field.

Water, because of its relative abundance in biological tissues and its relatively strong net magnetic moment $M_z$ created when placed within a strong magnetic field, is of principle concern in MR imaging. Subjecting human tissues to a uniform magnetic field will create such a net magnetic moment from the typically random order of nuclear precession about the z-axis. In a MR imaging sequence, a radio frequency (RF) excitation signal, centered at the Larmor frequency, irradiates the tissue with a vector polarization which is orthogonal to the polarization of $B_0$. Continuing our Cartesian coordinate example, the static field is labeled $B_a$ while the perpendicular excitation field $B_1$ is labeled $B_{xy}$. $B_{xy}$ is of sufficient amplitude and duration in time, or of sufficient power to nutate (or tip) the net magnetic moment into the transverse (x-y) plane giving rise to $M_{xy}$. This transverse magnetic moment begins to collapse and re-align with the static magnetic field immediately after termination of the excitation field $B_1$. Energy gained during the excitation cycle is lost by the nuclei as they re-align themselves with $B_0$ during the collapse of the rotating transverse magnetic moment $M_{xy}$.

The energy is propagated as an electromagnetic wave which induces a sinusoidal signal voltage across discontinuities in closed-loop receiving coils. This represents the NMR signal which is sensed by the RF coil and recorded by the MRI system. A slice image is derived from the reconstruction of these spatially-encoded signals using well known digital image processing techniques.

B. Local Coils and Arrays

The diagnostic quality or resolution of the image is dependent, in part, upon the sensitivity and homogeneity of the receiving coil to the weak NMR signal. RF coils, described as "local coils" may be described as resonant antennas, in part, because of their property of signal sensitivity being inversely related to the distance from the source. For this reason, it is important to place the coils as close to the anatomical region-of-interest (ROI) as possible.

Whereas "whole body" MRI scanners are sufficiently large to receive and image any portion of the entire human body, local coils are smaller and therefore electromagnetically couple to less tissue. Coupling to less tissue gives rise to coupling to less "noise" or unwanted biologically or thermally generated random signals which superimpose upon the desired MR signal. The local coils may be of higher quality factor (Q) than the body coils due to their smaller size. For all of these reasons, local coils typically yield a higher signal-to-noise S/N ratio ratio than that obtainable using the larger whole body antenna. The larger antenna is commonly used to produce the highly homogenous or uniform excitation field throughout the ROI, whereas the local coil is placed near the immediate area of interest to receive the NMR signal. The importance of accurate positioning leads to the development of local coils which conform to the anatomy of interest, yet function to permit ease of use.

While the smaller local coil's size works to an advantage in obtaining a higher S/N ratio, this reduced size also presents a disadvantage for imaging deep-seated tissues. Typically, the single- conductor coil diameter which yields the optimal S/N ratio at a depth 'd' is a coil of diameter 'd' ; hence, larger diameter single-conductor coils are required to image regions in the abdomen and chest of human patients. This increased coil size results in less than desirable performance, both in terms of S/N ratio and homogeneity of the sensitivity profile (which effects the uniform brightness of the image), and offers little advantage over the body coil of the system.

The S/N ratio of the NMR signal may be further increased by orienting two coils, or coil pairs about the imaged object so that each detects RF energy along one of a pair of mutually perpendicular axes. This technique is generally known as quadrature detection and the signals collected are termed quadrature signals.

The outputs of the quadrature coils are combined so as to increase the strength of the received signal according to the simple sum of the output signals from the coils. The strength of the noise component of these signals, however, will increase only according to the square root of the sum of the squares of the uncorrelated noise components. As a result, the net S/N ratio of the combined quadrature signals increases by approximately $\sqrt{2}$ over the S/N ratio of the individual coils.

The quadrature orientation of the two coils introduces a 90° phase difference between the NMR signals detected by these coils. Therefore, combining the outputs from the two quadrature coils to achieve the above described signal-m-noise ratio improvements requires that one signal be shifted to have the same phase as the other signal so that the amplitudes of the signals simply add in phase.

The approximate net gain of $\sqrt{2}$ in S/N ratio is achievable primarily due to the lack of inductive coupling between the coil pairs. This ensures that only the uncorrelated noise components add, in lieu of both the uncorrelated and correlated noise components, to reduce the effective S/N ratio. Inductive isolation is achieved by geometrically orienting the coil conductors such that the mutual inductance is minimized between the coil pairs according to the following:

$$M = \frac{1}{2\pi} \frac{I_1(dl_1) \cdot I_2(dl_2)}{|(r_1) - (r_2)|}$$

where M represents the mutual inductance between coils 1 and 2 and the vector components $dl_1$, and $dl_2$ represent segments of coils 1 and 2 with current amplitudes $I_1$ and $I_2$. The denominator represents the magnitude difference of the position vectors of each dl segment. The condition wherein M is approximately zero with respect to the individual self inductances of coils 1 and 2, is known as inductive isolation between the coils.

A method of increasing the S/N ratio of the NMR signal over a larger region is to digitally add the post processed signals derived from more than one coil; each sensitive to the precessing nuclei within overlapping volumes. If two coils' signals are processed and converted into image data separately and then added digitally, one can obtain an increase in S/N ratio within the larger volume. Separate amplifiers, analog-to-digital converters, and image processor channels represent an alternative configuration for processing the two signals in lieu of a single quadrature combiner. A system of four channels whose signals are derived from an array of four coils is described in U.S. Pat. No. 4,825,162. In the '162 patent, an array of coils is described wherein the adjacent coils overlap to prevent nearest-neighbor interaction (inductive coupling). The interaction between the next-nearest-neighbor is supposedly reduced by connection of each coil of the array to low input impedance preamplifiers.

The problem with this solution is, among other things, the use of preamplifiers with low input impedance. This additional circuitry is costly and adds another set of possible failure modes into the system. This preamplifier circuitry is sensitive to coil impedance changes resulting from patient loading variations as well as to noise spikes or power surges within the receiver chain.

One can minimize the effects of next-nearest-neighbor interaction if one properly utilizes the formulation above and in the following arguments to minimize inductive coupling between all resonant structures. In this case, the additional preamplifier circuitry is no longer required.

First, nearest-neighbor or adjacent coil interaction is a much more dominant coupling than the next-nearest-neighbor coupling—usually one or two orders of magnitude larger depending upon coil size and spacing. Second, if near-neighbor coupling has not been sufficiently minimized, then next-nearest neighbor coupling will occur via neighbor-to-neighbor interaction as strongly as, or stronger than inductive coupling between next-nearest-neighbors. Third, next-nearest neighbor interaction (inductive coupling) is further reduced towards zero when the next-nearest-neighbor coils are dominantly loaded by coupling to patient tissues. Such is the case in mid to high field scanners operating above 20 MHz. The coil's impedance is also dominated resulting from coupling to eddy current loops generated within the patient tissues. This is predicted from the mutual impedance formulation $$Z_{1d} = Z_{11} + \frac{I_2}{I_1} Z_{12}$$

where $Z_{1d}$ is the driving or output impedance of coil 1, $Z_{11}$ is the self-impedance of coil 1, $(I_2/I_1)$ is the ratio of induced eddy currents (loop 2) to the current in coil 1, and $Z_{12}$ is the mutual impedance between the loops which is equal to the radian frequency times the mutual inductance between said loops.

The implication from the above three facts is as follows. If one ensures consistent and dominant loading of the coil elements and if one ensures that near-neighbor coupling has been minimized (that is, inductive isolation has been achieved), and if the antenna element size, geometrical orientation, and spacing is designed so as to minimize next-nearest neighbor coupling, then the array will work properly with little degrading interaction amongst the elements.

Inductive isolation is achieved by geometrically orienting two coil conductors such that their mutual inductance is minimized according to the above formulation. The condition wherein M is approximately zero with respect to the individual self inductances of coils 1 and 2, is known as geometric isolation between the coils. This is a special case of inductive isolation but is restrictive in application, as discussed below.

As the coil geometries are sufficiently large or close to the surrounding system conductors (antenna, faraday screen, cryostat tubing, etc.) in addition to the biological conducting medium, this coupling formula must be extended to include $M = M_{12} + M_{13} + M_{23}$; where the first term on the right side of the equation is as described above, and the latter two terms define the coupling resulting from each coil's coupling to eddy current loops (loop 3) generated on or within the surrounding conductors (system or biological). These additional coupling terms must be accounted for in the adjustment of conductor geometries with respect to each other spatially. With these terms taken into account, the proper critical spacing may be found between coil loops 1 and 2.

Phased array coils such as described in U.S. Pat. Nos. 4,825,162 and 5,198,768 only utilize linear coil technology to create an array of coils; each sensitive to one vector component of the NMR signal in a unique imaging volume to create a coil set with a large ROS. Both of those patents focus on obtaining a larger region of sensitivity using a bank of coils whose signals input to separate preamplifiers and digital reconstruction ports on a computer. This does not produce the optimal S/N ratio from within the imaging volumes such as would be the case where two coil elements are sensitive to orthogonal vector components of magnetic flux within each volume (i.e. an array of quadrature elements). The prior art is reliant upon geometric isolation and/or low impedance preamps with no compensation for eddy current-induced coupling. The prior art also restricts the geometry to a planar surface only. This restriction is due, in part, to the fact that the prior art is dependent upon geometric isolation only, and this alone is inadequate to ensure sufficient isolation between non-adjacent pairs of non-planar conductors. This type of coil array presents engineering challenges in maintaining isolation between elements as additional elements are co-located in space, thereby increasing the potential for inductive coupling.

SUMMARY OF THE INVENTION

It is an object of the present invention to provide an improved NMR local coil designed to conform to a patient's particular anatomical region and place antenna conductors within close proximity to the entirety of said anatomy.

Another object is to provide an antenna geometry which permits ease of positioning on or about the patient anatomy.

Still another object is to provide a set of coil conductors which closely couple their regions of sensitivity to a desired region of a patient in a quadrature fashion.

Another object of the present invention is to provide improved electronic configurations of coil conductors which yield a higher signal-to-noise ratio over a larger ROS than other configurations.

Another object is to provide an array of quadrature coil elements which will interface with a multiple-channel receiver system and yield an improved S/N ratio over a very large region of interest.

The NMR Quadrature Detection Array of the present invention includes two generally linear arrays; one oriented in a horizontal plane and sensitive to vertically oriented changing magnetic flux, and the other oriented in a vertical plane bisecting the horizontal plane and sensitive to horizontally oriented flux changes. Each horizontal coil is electronically paired with a vertical coil such that their NMR signals are combined in a quadrature fashion before transmission to the NMR system preamplifier. The coil arrays are sized to accommodate easy positioning within the NMR system table top assembly as well as to facilitate rapid and easy patient positioning about the coil elements. The legs of a patient rest on top of the horizontal section while straddling the vertical section; hence quadrature detection is possible over the entire length of both legs, and sections of the coil can be activated or de-activated for imaging smaller or larger fields-of-view.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference must be made therefore to the claims herein for interpreting the scope of the invention.

BRIEF DESCRIPTION OF THE DRAWINGS

FIG. 1 is a perspective view of the NMR Quadrature Detection Array of the present invention;

FIG. 2 is a perspective schematic view of the conductor configuration of the present invention shown in FIG. 1;

FIG. 3 is an elevational view of two vertical coils of the invention;

DESCRIPTION OF THE PREFERRED EMBODIMENT

Figure 4:
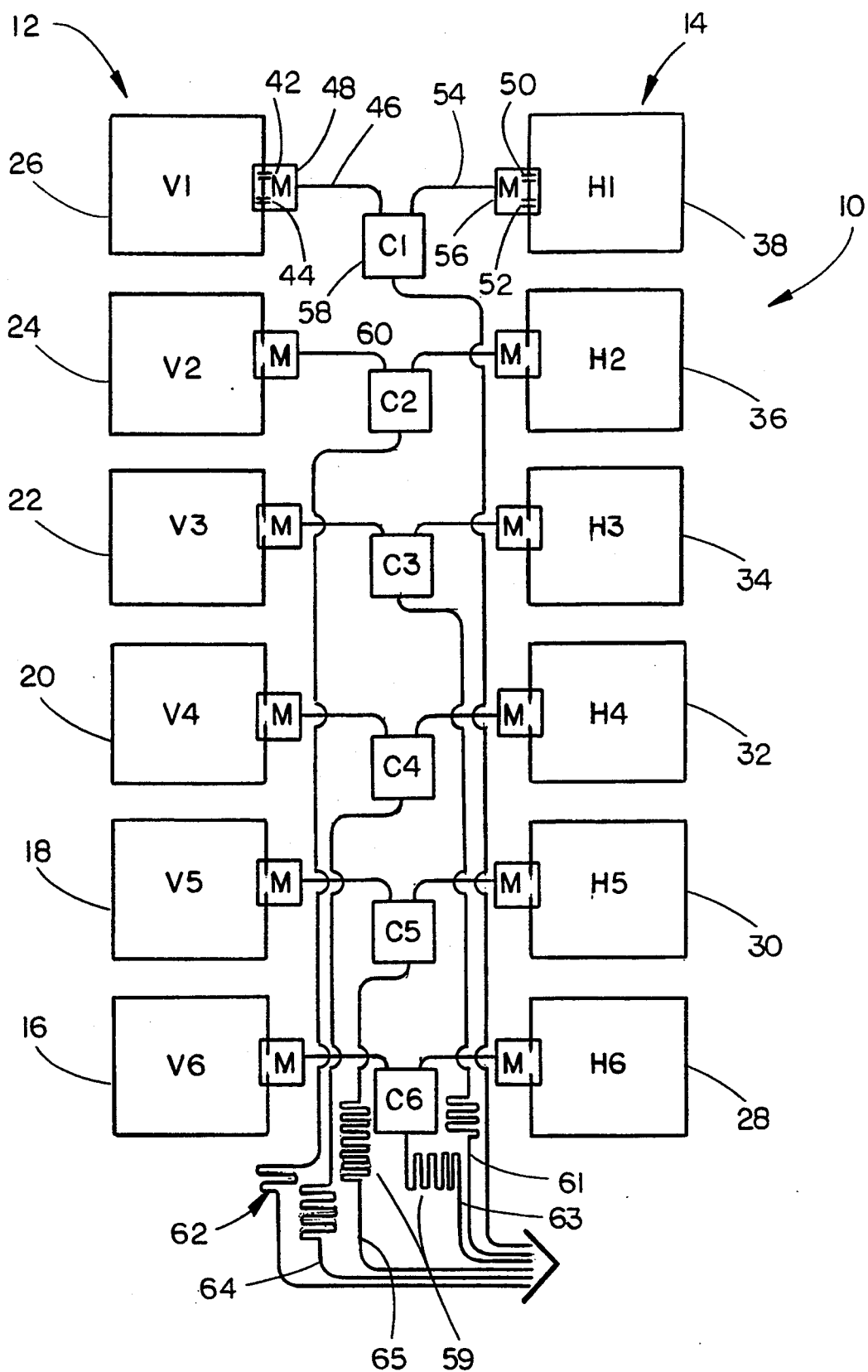
FIG. 4 is a simplified block diagram of the coil array of FIG. 1.

Referring now to the drawings, in which similar or corresponding parts are identified with the same reference numeral, and more particularly to FIG. 1, the NMR quadrature detection lower extremity array of the present invention is designated generally at 10 and includes a generally vertically oriented segment 12 mechanically connected to a generally horizontally oriented posterior segment 14, to form an inverted "T" shape.

Referring now to FIG. 2, vertical segment 12 includes a plurality of electronic NMR coils 16, 18, 20, 22, 24 and 26 enclosed within a durable plastic housing 15 (shown in FIG. 1). Each of these coils is resonant to the NMR signal frequency and inductively isolated from other adjacent and non-adjacent vertical coils by way of adjustment of coil overlap, with compensation for surrounding eddy current-induced coupling effects, and by appropriate coil sizing to minimize cross-talk of non-adjacent pairs. Note in FIG. 3 that the coil loops (loops 16 and 18 for example) have mitered corners 17 at 45 degrees such that the overlapping conductors have minimal overlapping surface area. Minimizing this area minimizes the capacitive coupling which exists between adjacent conductors; hence further improving intercoil isolation. The mitered corners also prevent conductor segments from adjacent coils, which are in extremely close proximity to one another, from having parallel currents. Forcing these proximal segments to be orthogonal to one another also minimizes this inductive coupling mechanism.

Similarly, horizontal segment 14 includes a plurality of electronic NMR coils 28, 30, 32, 34, 36, and 38 enclosed within a common plastic housing 15 (shown in FIG. 1) with the coils of the vertical segment 12. Each of the horizontally opposed coils is also inductively isolated from other adjacent (via overlaps such as 40) and non-adjacent horizontal coils as discussed above. Geometric isolation via precise centering of segment 12 with respect to segment 14 is all that is required to inductively isolate the vertical coils of segment 12 from the horizontally opposed coils of segment 14.

Referring now to FIG. 4, each vertical coil (V1–V6) is paired with the adjacent horizontal coil (H1–H6) via electronic connection to a quadrature combiner circuit (C1–C6). Each of the six coil pairs is identical in as far as general electrical schematic so the following discussion will focus on one coil pair V 1 and HI, 26 and 38 respectively. Coil 26 develops NMR signal across junction capacitors 42 and 44 resulting from changing horizontally oriented magnetic flux components generated by the NMR system. The impedance across either of the capacitors 42 or 44 is matched to the impedance of 50-ohm transmission line 46 via a matching circuit 48.

Figure 5:
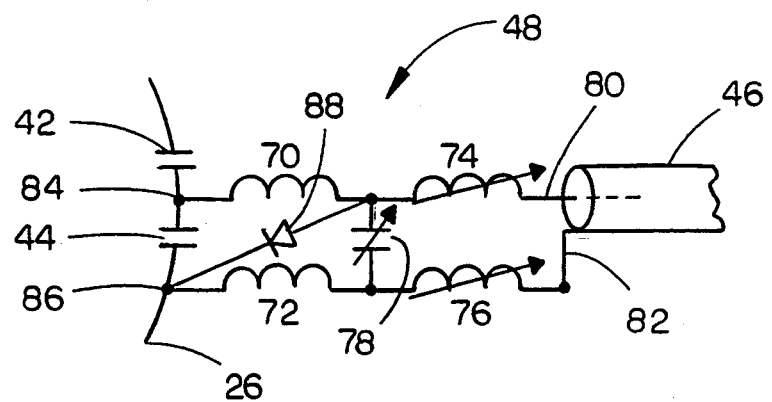
FIG. 5 is an electrical schematic of the decoupling and impedance matching boards.

Referring now to FIG. 5, the electrical schematic of circuit board 48 is shown. Since the component scheme is identical to that of all matching boards, designated with M on FIG. 3, only circuit board 48 will be described in detail. Series capacitors 42 and 44 are sized to appropriately resonate the coil loop 26. This series configuration reduces the total impedance across the capacitor 44 which must be impedance matched to the 50 ohm transmission line 46. Inductors 70, 72, 74, and 76 and capacitor 78 form a "modified Tee" impedance matching network which matches the complex impedance developed across capacitor 44 to the 50 ohm transmission line 46. Inductors 70 and 74 are series connected between capacitors 42 and 44 and one conductor 80 of transmission line 46. Inductors 72 and 76 are series connected between the opposite side of capacitor 44 and a second conductor 82 of transmission line 46. One terminal of capacitor 78 is connected between inductors 70 and 74, while the other terminal of capacitor 78 is connected between inductors 72 and 76, to form the "modified Tee". Whereas inductors 70 and 74 in conjunction with capacitor 78 would be the "standard Tee" configuration, the additional inductors 72 and 76 modify the standard Tee and serve two purposes. First, they are designed to be approximately equal in inductance to inductors 70 and 74; hence creating a balanced-to-unbalanced impedance transformer ("balun" to those versed in radio frequency (RF) electronics). Second, dividing the total circuit inductance evenly onto both conductors 80 and 82 of the transmission line 46 also keeps both nodes 84 and 86 above earth ground so as to prevent establishment of an RF ground within the sensitive receiver system. Such an RF ground can produce undesirable effects upon the magnetic field homogeneity within the NMR system.

Diode 88 is connected at one end between inductors 70 and 74, and at the other end to node 86, and serves as a decoupling diode which is activated by system-provided direct current (DC)—voltage pulses. During the transmit mode of the MRI data acquisition cycle, a DC voltage forward biases diode 88 into a conduction state; hence, effectively placing inductor 70 in parallel with capacitor 44. Together these components create a high impedance circuit to the RF currents induced upon the resonant coil structure, loop 26, thereby decoupling the coil loop from the transmit antenna power.

Referring again to FIG. 4, coil 38 develops NMR signal across junction capacitors 50 and 46 resulting from changing vertically oriented magnetic flux. Similarly, the impedance across capacitor 46 is matched to the impedance of transmission line 54 via matching circuit 56. Cables 46 and 54 carry NMR signal to the combiner circuit 58 (C1) for phase shifting and quadrature addition before the combined output is transmitted to the system preamplifier via cable 60.

All coil pairs (V2, H2; V3,H3, etc.) operate identically to that of pair V1, H1 (coils 26 and 38), and all matching boards (denoted with M) are identical in operation as are all combiner boards (C1–C6).

All transmission lines, 60–65, from the combiner (C1–C6) outputs are identical in length to maintain the same NMR signal phase shift between the coils in the array and the system preamplifier. This is to ensure proper digital encoding and further processing in the time domain. Note that to ensure equal lengths of transmission lines, non-overlapping 'S' loops 59 are made in the cables connecting the combiners which are located closer to the preamplifier.

Figure 6:
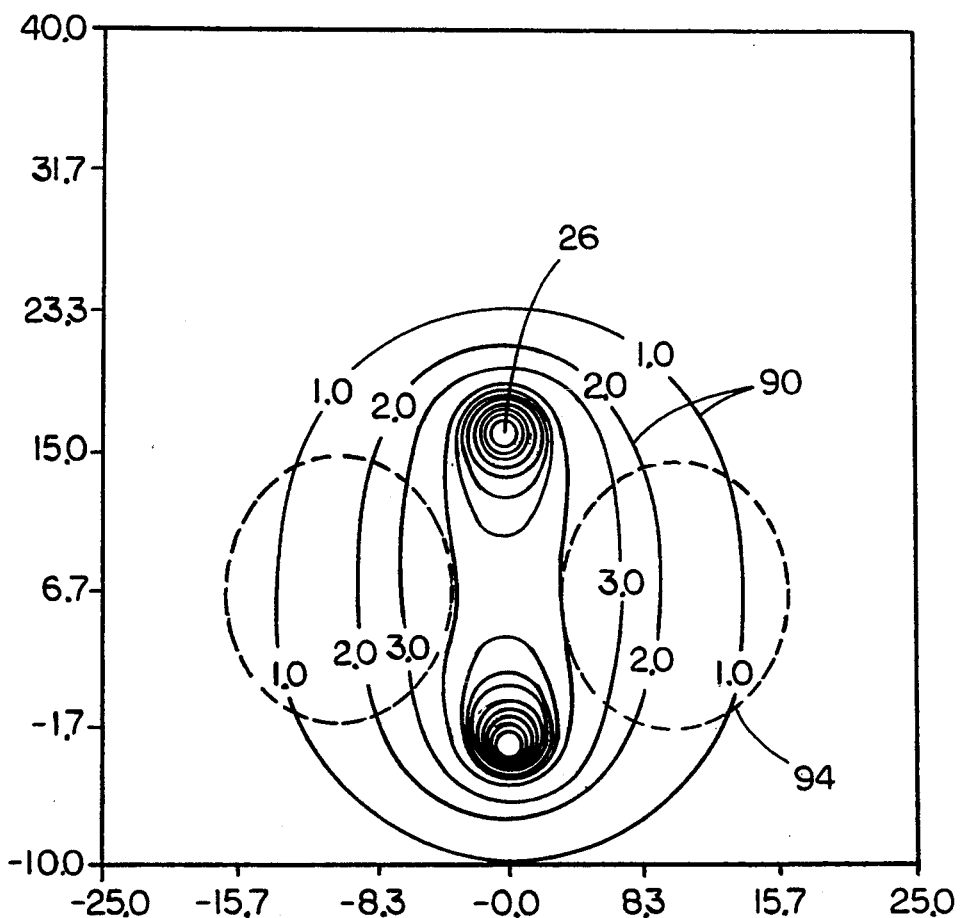
FIG. 6 is a flux sensitivity profile of a vertical coil section of the coil array of FIGS. 2 and 4.
Figure 7:
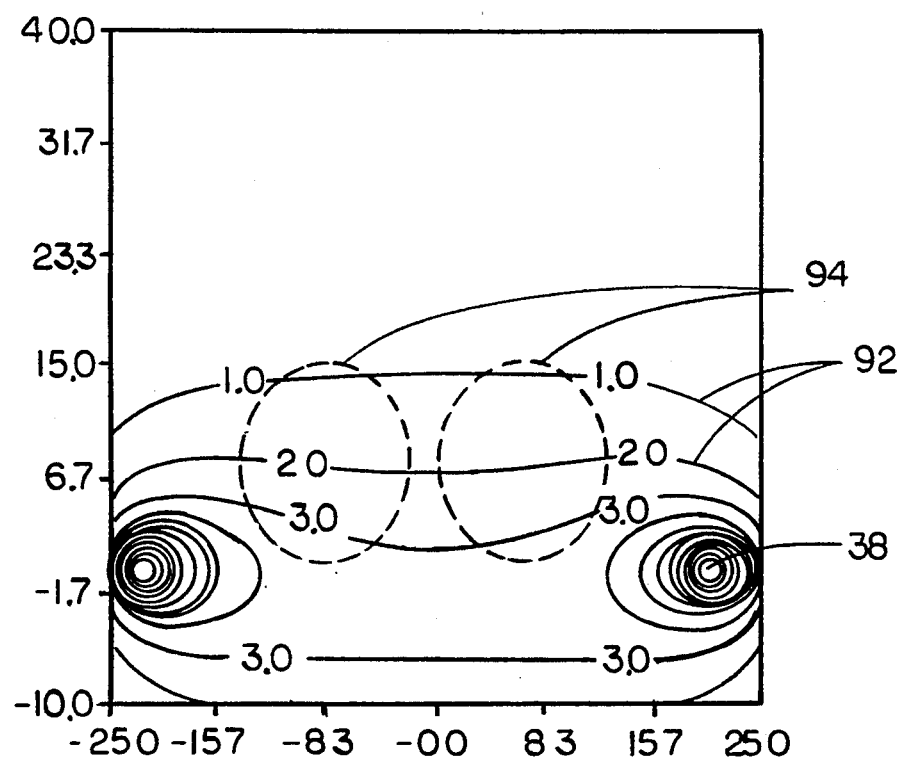
FIG. 7 is a flux sensitivity profile of a horizontal coil section of the coil array of FIGS. 2 and 4.

Referring now to FIGS. 6 and 7, iso-magnetic flux contour plots 90 and 92 of both a vertical coil 26 and a horizontal coil 38, respectively, are shown superimposed upon the cross-section of human legs 94. Note that the iso-flux contours of the figures represent the same unit of magnetic field per unit current upon the coil conductor (H/I), and that each contour line is plotted with the same incremental change in comparison to the adjacent contours. The corresponding direction of the equal-magnitude contours 90 and 92 at their points of intersection within the human tissues reveal the degree of orthogonality of the two coil's (26 & 38) sensitivity profiles. At points where there exists equal magnetic flux contours at right angles to each other, there is maximum quadrature gain. A computer program has been utilized to maximize the number of points where this condition occurs within the volume of the human tissue, and within geometrical constraints such as coil size and shape limitations.

Figure 8:
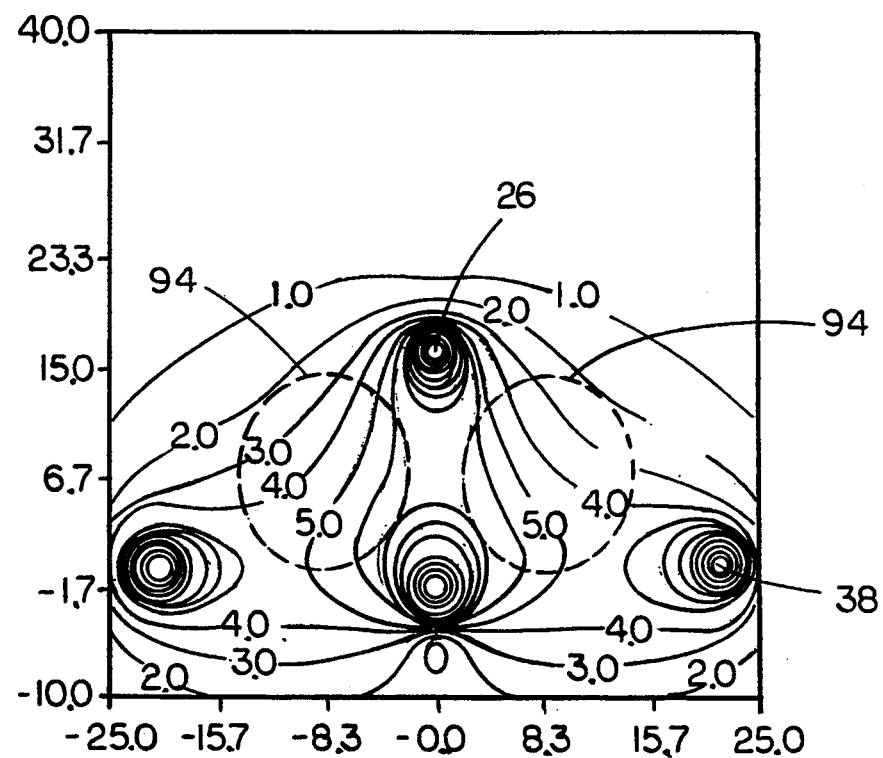
FIG. 8 is a diagram of the flux sensitivity profile of one pair of the antenna loops of FIGS. 1 and 2.

FIG. 8 represents the quadrature combination of the two coil's (26 & 38) fields within the same geometric region as in FIGS. 6 and 7. Note that we have optimal quadrature gain throughout the majority of the phantom volume. This condition holds over the entire length of the array of FIGS. 1 and 2; hence an array of quadrature detection coils is presented.

Whereas the invention has been shown and described in connection with the preferred embodiments thereof, it will be understood that many modifications, substitutions and additions may be made which are within the intended broad scope of the appended claims. There has therefore been shown and described an improved NMR local coil which accomplishes at least all of the above stated objects.

I claim:

1. An array of NMR coils for simultaneously receiving similar and different electronic NMR response signals, comprising:
   a first set of coils mounted within a generally planar horizontal housing;
   said horizontal housing having forward and rearward longitudinal ends, and opposing transverse side edges;
   said first set of coils including a plurality of horizontal coils, each horizontal coil extending transversely substantially from side edge to side edge in said horizontal housing;
   a second set of coils mounted within a generally planar vertical housing, attached to said horizontal housing;
   said vertical housing having forward and rearward longitudinal edges, and opposing upper and lower edges;
   said vertical housing extending longitudinally from end to end on said horizontal housing, generally centrally between said side edges;
   said second set of coils including a plurality of vertical coils equal in number to said horizontal coils, each vertical coil extending vertically substantially from lower to upper edges in said vertical housing.

2. The array of claim 1, wherein said horizontal coils have substantially equal longitudinal lengths, wherein said horizontal coils have substantially equal transverse widths, wherein said vertical coils have substantially equal longitudinal lengths, wherein said vertical coils have substantially equal vertical heights, and wherein the longitudinal lengths of said horizontal and vertical coils are substantially equal.

3. The array of claim 2, wherein each vertical coil is oriented with its longitudinal length aligned with the longitudinal length of a horizontal coil, to form a plurality of coil pairs, each pair including an associated horizontal and vertical coil.

4. The array of claim 1, wherein said coils are located relative to one another so as to inhibit inductive coupling between adjacent coils.

5. The array of claim 1, wherein said coils are sized so as to inhibit inductive coupling between next nearest neighbor coils.

6. The array of claim 1, wherein said coils are located relative to one another so as to inhibit inductive coupling between said first and second sets of coils.

7. The array of claim 4, wherein said coils are located relative to one another so as to inhibit inductive coupling between said first and second sets of coils.

8. The array of claim 5, wherein said coils are located relative to one another so as to inhibit inductive coupling between said first and second sets of coils.

9. The array of claim 4, wherein inductive coupling between adjacent horizontal coils is inhibited by locating each horizontal coil so as to longitudinally overlap each longitudinally adjacent horizontal coil a predetermined distance, and wherein inductive coupling between adjacent vertical coils is achieved by locating each vertical coil so as to longitudinally overlap each longitudinally adjacent vertical coil a predetermined distance.

10. The array of claim 6, wherein inductive coupling between said first and second sets of coils is inhibited by locating said second of coils in a generally vertical plane substantially orthogonally bisecting the plane of the first set of coils with lower ends of the vertical coils tangent to the plane of the first set of coils.

11. The array of claim 9, wherein each said coil is a generally rectangular-shaped loop having forward and rearward elements and opposing side elements, said coils being overlapped such that the forward elements of each coil project forwardly beyond the rearward element of the next forwardly adjacent coil and the rearward element of each coil projects rearwardly beyond the forward element of the next rearwardly adjacent coil.

12. The array of claim 11, wherein each coil loop corner has a corner element oriented at approximately 45° relative to the adjacent loop elements which it connects, and wherein adjacent coils overlap at corner elements such that overlapping corner elements are generally perpendicularly to one another.

13. The array of claim 1, wherein said horizontal housing and coil set are curved slightly from side edge to side edge to follow the curvature of a NMR system couch top.

14. A quadrature surface coil array for use in detecting magnetic resonance imaging energy, comprising:
a first coil set comprising a plurality of generally coplanar coils, for generating NMR signals in response to t a first vector component of free induction decay of NMR signal-generating nuclei;
a second coil set, comprising a plurality of generally coplanar coils, for generating NMR signals in response to a second vector component of free induction decay of NMR signal-generating nuclei;
said second coil set geometrically oriented relative to the first coil set to inductively isolate the coils of the first set from the coils of the second coil set; and
means for electrically connecting said first and second coil sets to inhibit stray capacitive and inductive coupling between said sets.

15. The array of claim 14:
wherein said plurality of coils of said first coil set is equal in number to said plurality of coils of said second coil set;
wherein each coil of said first coil set is associated in quadrature with each coil of said second coil set to form a plurality of quadrature coil pairs;
wherein said means for electrically connecting said first and second coil sets further includes:
means for electronically adding NMR signals generated by each coil of each coil pair and for generating a quadrature NMR output for each coil pair; and
means electrically connected to said means for generating NMR outputs, for transmitting said generated quadrature NMR outputs to magnetic resonance imaging apparatus.

16. The array of claim 15:
wherein said means for electronically adding said NMR signals and generating quadrature NMR outputs includes:
a plurality of combiner means, each combiner means electrically connected to each of said plurality of coil pairs, for phase shifting a signal from the first individual coil 90° relative to a signal phase of the second individual coil, and for adding the two signals of a coil pair;
each said combiner creating quadrature NMR signals from the geometric quadrature location to which each coil pair is sensitive.

17. The array of claim 16, further comprising a co-axial cable electrically connecting each individual coil of a coil pair to the associated combiner means, each coaxial cable including a conductor and a shield, with an RF trap electrically connected to the shield of each co-axial cable adjacent to each combiner to inhibit capacitive coupling between coil pairs.

18. The array of claim 17, further comprising a plurality of second co-axial cables, each second co-axial cable electrically connecting each combiner means to said NMR imaging apparatus, said second co-axial cables all being equal in length.

19. The array of claim 18, wherein each said coil of said first and second coil sets has a predetermined region of sensitivity, and wherein said second coaxial cables are bundled in a geometrically isolated fashion away from said regions of sensitivity.

20. The array of claim 14, wherein the plane of said second coil set is generally flat and wherein the plane of said first coil set follows a generally cylindrical surface.

* * * * *